United States Patent
Cho et al.

(10) Patent No.: US 7,666,292 B2
(45) Date of Patent: Feb. 23, 2010

(54) METHOD OF MANUFACTURING PRINTED CIRCUIT BOARD USING IMPRINTING PROCESS

(75) Inventors: Jae Choon Cho, Gyeonggi-do (KR); Il Sang Maeng, Gyeonggi-do (KR); Choon Keun Lee, Gyeonggi-do (KR); Seung Hyun Ra, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 754 days.

(21) Appl. No.: 11/334,240

(22) Filed: Jan. 17, 2006

(65) Prior Publication Data

US 2006/0240360 A1 Oct. 26, 2006

(30) Foreign Application Priority Data

Apr. 20, 2005 (KR) .................. 10-2005-0032701

(51) Int. Cl.
*C25D 5/02* (2006.01)
(52) U.S. Cl. .................. 205/126; 205/222; 438/687
(58) Field of Classification Search .................. 205/118, 205/126, 222; 438/678, 680, 687, 780, 781
See application file for complete search history.

(56) References Cited

U.S. PATENT DOCUMENTS

| | | | |
|---|---|---|---|
| 4,912,844 A | 4/1990 | Parker | |
| 6,730,617 B2* | 5/2004 | Carter | 438/780 |
| 2004/0046288 A1 | 3/2004 | Chou | |
| 2004/0118594 A1 | 6/2004 | Dory et al. | |
| 2004/0124533 A1* | 7/2004 | Keser et al. | 257/758 |
| 2004/0182820 A1* | 9/2004 | Motowaki et al. | 216/44 |
| 2004/0251537 A1* | 12/2004 | Choi | 257/701 |

FOREIGN PATENT DOCUMENTS

| | | | |
|---|---|---|---|
| JP | 06003515 A | * | 1/1994 |
| JP | 2001-230526 A | | 8/2001 |
| JP | 2001-320150 A | | 11/2001 |
| JP | 2004-152934 A | | 5/2004 |
| JP | 2004349357 | | 12/2004 |
| JP | 2004356255 | | 12/2004 |

* cited by examiner

*Primary Examiner*—Nam X Nguyen
*Assistant Examiner*—Luan V Van
(74) *Attorney, Agent, or Firm*—Darby & Darby P.C.

(57) ABSTRACT

The present invention relates to a method of manufacturing a printed circuit board using an imprinting process, in which a pattern having a large area can be uniformly formed using a plurality of molds, and the plurality of molds is sequentially removed, thereby solving problems occurring in release of the molds from an insulating layer.

2 Claims, 4 Drawing Sheets

METHOD OF MANUFACTURING PRINTED CIRCUIT BOARD USING IMPRINTING PROCESS

INCORPORATION BY REFERENCE

The present application claims priority under 35 U.S.C. §119 to Korean Patent Application No. 10-2005-0032701 filed on Apr. 20, 2005. The content of the application is incorporated herein by reference in its entirety.

BACKGROUND OF THE INVENTION

1. Field of the Invention

The present invention relates, generally, to a method of manufacturing a printed circuit board (PCB), and more particularly, to a method of manufacturing a PCB using an imprinting process, which is advantageous because a pattern having a large area can be uniformly formed using a plurality of molds, and the plurality of molds is sequentially removed to solve problems occurring in release of the molds from an insulating layer.

2. Description of the Related Art

Recently, techniques for directly mounting semiconductor chips on PCBs, instead of CSP (Chip-Sized Package) mounting or wire bonding mounting, are increasingly required to correspond to high densities and high signal transfer speeds of semiconductor chips. In order to directly mount the semiconductor chip on the PCB, a highly dense and reliable PCB, corresponding to the high density of the semiconductor, must be developed.

Requirements for a highly dense and reliable PCB, which are closely concerned with specifications of semiconductor chips, include fineness of circuits, high electrical properties, high signal transfer speed structures, high reliability, multiple functionality, etc. Thus, such requirements are expected to be satisfied through techniques for manufacturing a PCB, capable of forming a fine circuit pattern and a micro-via hole.

Typically, a PCB has been manufactured using a photo-lithographic process that is advantageous thanks to its high productivity and low manufacturing cost. The photo-lithographic process for the formation of a fine circuit pattern on a PCB includes applying a photo-resist to a uniform thickness on a substrate, exposing and developing selected regions of photo-resist, forming a plating layer of conductive material, removing the residual photo-resist, and removing the unnecessary electroless plating layer of conductive material through etching.

However, the conventional method of manufacturing a PCB using such a photo-lithographic process entails two disadvantages as mentioned below, upon formation of an L/S of 10 μm/10 μm or less, in which "L" means lines, defining the width of the line, and "S" means spaces between the lines.

First, the conventional method of manufacturing a PCB using a photo-lithographic process yields limited adhesion at the interface between the photo-resist and the substrate when the L/S is formed to 10 μm/10 μm or less.

Second, the conventional method of manufacturing a PCB using a photo-lithographic process entails a problem of undercut of the circuit pattern upon removal of the unnecessary electroless plating layer of conductive material, resulting in a disconnected or delaminated fine circuit pattern.

With the goal of overcoming such problems, U.S. Pat. No. 4,912,844, and US Publication Nos. 2004/0046288 A1 and 2004/0118594 A1, and Japanese Patent Laid-open Publication Nos. 2001-230526, 2001-320150 and 2004-152934 disclose a method of manufacturing a PCB using an imprinting process.

However, in cases where an imprinting process is applied to form a circuit pattern on a large PCB having a size of about 405 mm×510 mm or more for mass production, the following three problems are caused.

First, the conventional method of manufacturing a PCB using an imprinting process suffers because a substrate (or epoxy resin) is imprinted with a large mold (or stamp), and thus, a uniform circuit pattern is difficult to form.

Second, the conventional method of manufacturing a PCB using an imprinting process suffers because an adhesion phenomenon between the mold (or stamp) and the substrate (or epoxy resin) may occur upon release of the large mold (or stamp) from the substrate (or epoxy resin), and thus, the pattern imprinted into the substrate (or epoxy resin) may be easily damaged and previously designed fine circuit patterns are difficult to form.

Third, the conventional method of manufacturing a PCB using an imprinting process suffers because a large mold (or stamp) is prepared, and thus, the design of such a mold (or stamp) is difficult to vary and a lot of time and expense is required to vary the design.

SUMMARY OF THE INVENTION

Accordingly, an object of the present invention aiming to solve the problems encountered in the related art is to provide a method of manufacturing a PCB using an imprinting process, which can form a uniform circuit pattern.

Another object of the present invention is to provide a method of manufacturing a PCB using an imprinting process, which does not cause a release problem.

A further object of the present invention is to provide a method of manufacturing a PCB using an imprinting process, in which a design for a mold can easily be varied, thus decreasing time and expense required for the variation of the design.

In order to accomplish the above objects, the present invention provides a method of manufacturing a PCB using an imprinting process, including aligning a plurality of molds, each of which has a pattern corresponding to a circuit pattern, on a base substrate having an insulating layer laminated thereon; imprinting the insulating layer of the substrate with the plurality of molds, and curing the insulating layer; removing the molds from the insulating layer, to form grooves of circuit patterns in the insulating layer; forming an electroless plating layer on the insulating layer and in the grooves of the circuit patterns; forming an electroplating layer on the electroless plating layer; and polishing the electroless plating layer and the electroplating layer until the insulating layer is exposed.

In the method of manufacturing a PCB using an imprinting process, according to the present invention, it is preferred that the imprinting of the insulating layer of the substrate with the plurality of molds and the curing of the insulating layer be simultaneously conducted.

In the method of manufacturing a PCB using an imprinting process, according to the present invention, it is preferred that the removing of the molds from the insulating layer be conducted by sequentially removing one or more molds from the insulating layer.

DETAILED DESCRIPTION OF THE INVENTION

Hereinafter, a detailed description will be given of a method of manufacturing a PCB using an imprinting process according to the present invention, with reference to the appended drawings.

Figure 1:
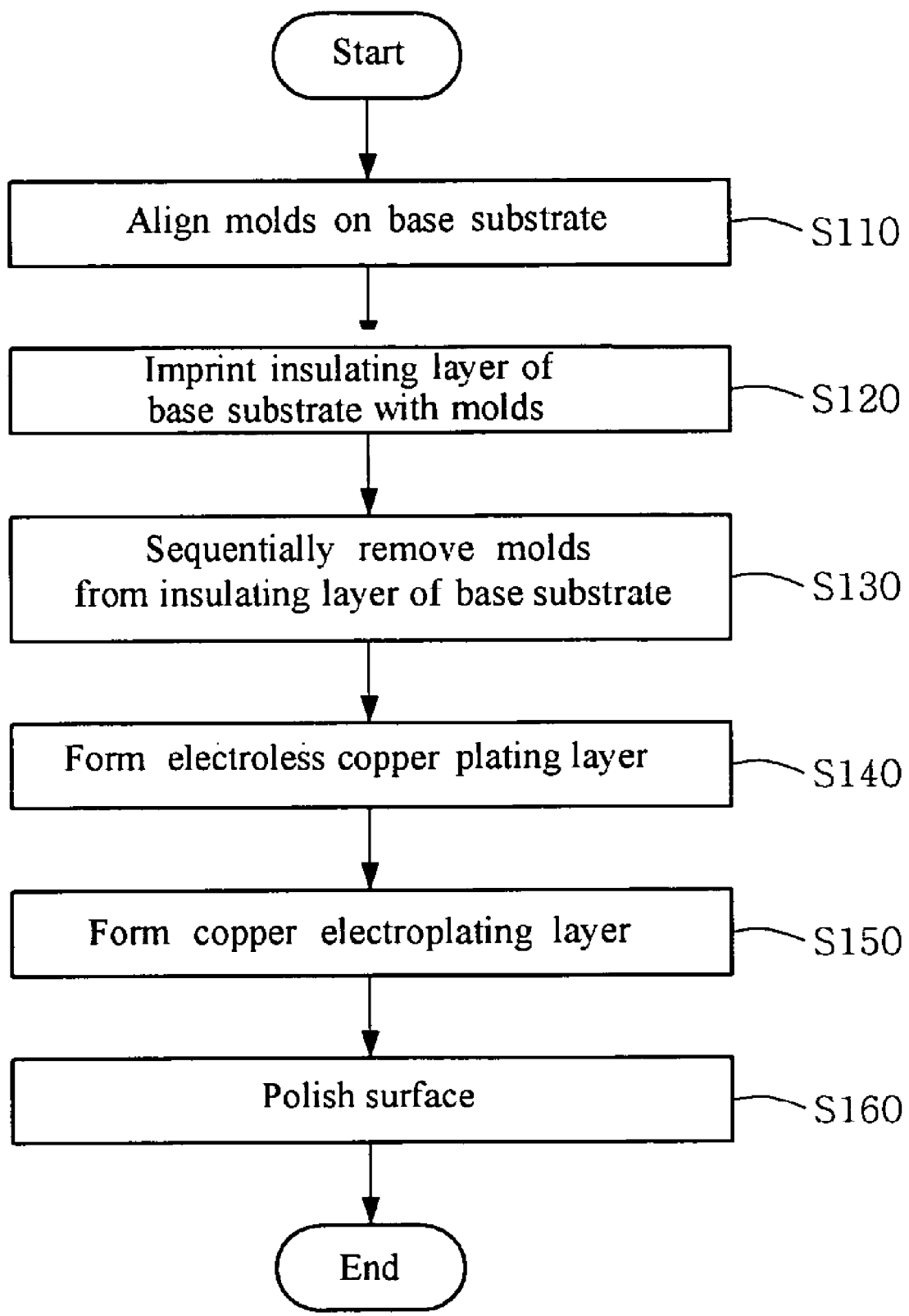
FIG. 1 is a flowchart showing a process of manufacturing a PCB through imprinting, according to the present invention.

FIG. 1 is a flowchart showing a process of manufacturing a PCB through imprinting, according to the present invention, and FIGS. 2A to 2F are perspective views sequentially showing the process of manufacturing a PCB through imprinting, according to the present invention.

As shown in FIG. 1, the method of manufacturing a PCB using an imprinting process, according to the present invention, includes aligning a plurality of molds on a base substrate (S110), imprinting the insulating layer of the base substrate with the plurality of molds (S120), sequentially removing the molds from the insulating layer of the base substrate (S130), forming an electroless copper plating layer (S140), forming a copper electroplating layer (S150), and polishing the surface of the plating layer (S160).

Figure 2A:
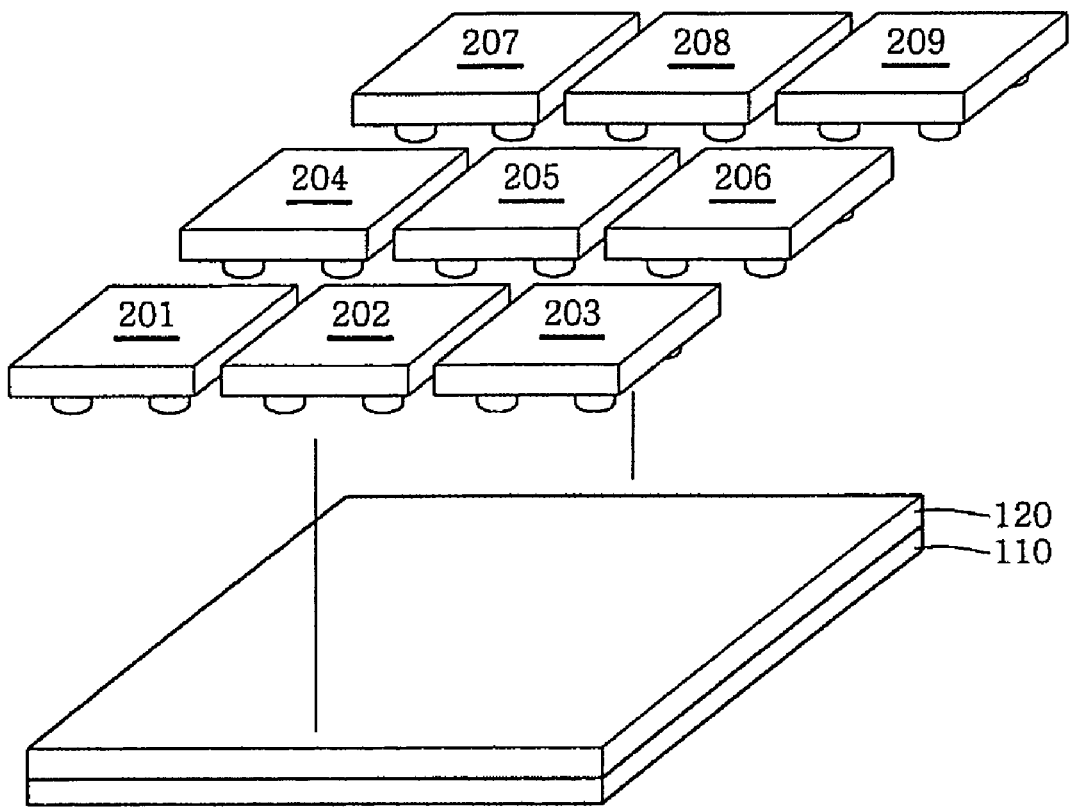
FIGS. 2A to 2F are perspective views sequentially showing the process of manufacturing a PCB through imprinting, according to the present invention.

Specifically, as shown in FIG. 2A, a plurality of molds 201-209, each of which has a negative circuit pattern and a regular size, is aligned on a base substrate 110 having an insulating layer 120 laminated thereon (S110).

The base substrate 110 may be a support for supporting the insulating layer 120 laminated thereon, and may be a board having a predetermined circuit pattern on a surface thereof on which the insulating layer 120 is laminated.

The insulating layer 120, which is in a state of being partially cured, is formed of an insulating material, such as bismaleimide, epoxy, polycarbonate, polyester, or polyimide.

Each of the molds 201-209 is formed of transparent material, such as glass, quartz, polymer, etc., or opaque material, such as semiconductor material, ceramic, metal, polymer, etc.

A technique for preparing such molds 201-209 includes processing one surface of each of a plurality of plates to have a negative circuit pattern. In this case, since the plurality of molds 201-209 can be prepared on a large scale using a single master, designs for the molds 201-209 may be easily varied, and preparation time and expense are decreased to vary the design. Further, one surface of the plate may be processed by means of electron beam lithography, photo-lithography, dicing, laser, RIE (Reactive Ion Etching), etc.

The plurality of molds 201-209 thus prepared has negative circuit patterns the same as or different from each other.

Figure 2B:
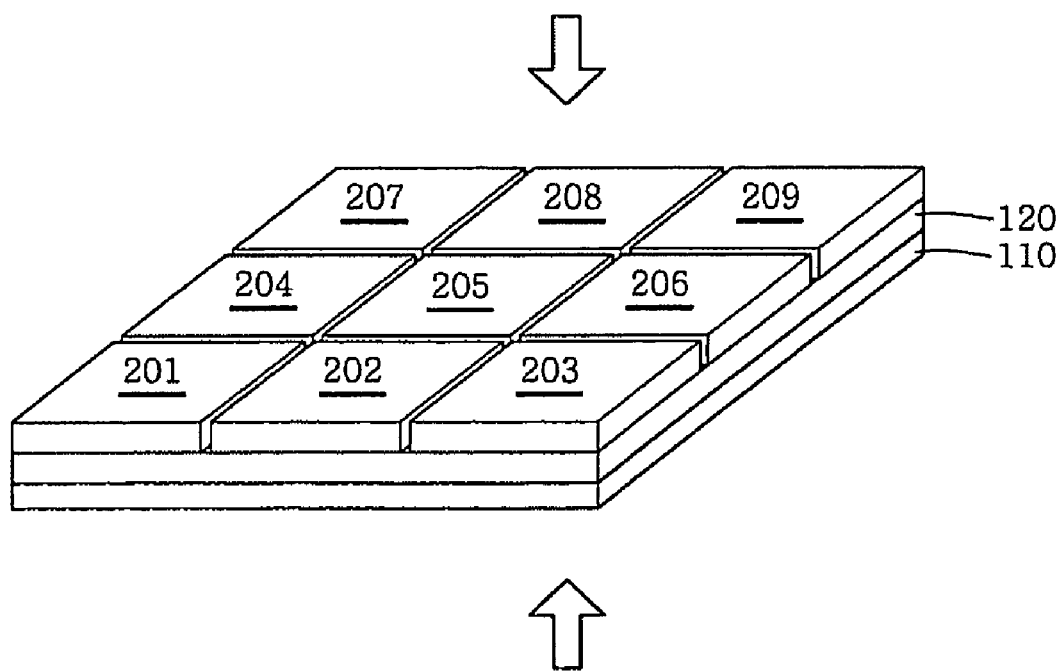

As shown in FIG. 2B, the insulating layer 120 of the base substrate 110 is imprinted with the plurality of molds 201-209, each of which has a negative circuit pattern (S120). At this time, a temperature from 10 to 200° C., preferably from 80 to 120° C., and pressure from 5 to 100 bar are applied to the molds 201-209 and the base substrate 110 for 1-60 min, to cure the insulating layer 120.

Alternatively, in the case where the plurality of molds 201-209 or the base substrate 110 are formed of transparent material, light (e.g., UV light), instead of heat, may be radiated onto the insulating layer 120 through the plurality of molds 201-209 or the base substrate 110, and thus the insulating layer 120 may be cured by light passing through the plurality of molds 201-209 or the base substrate 110.

Figure 2C:
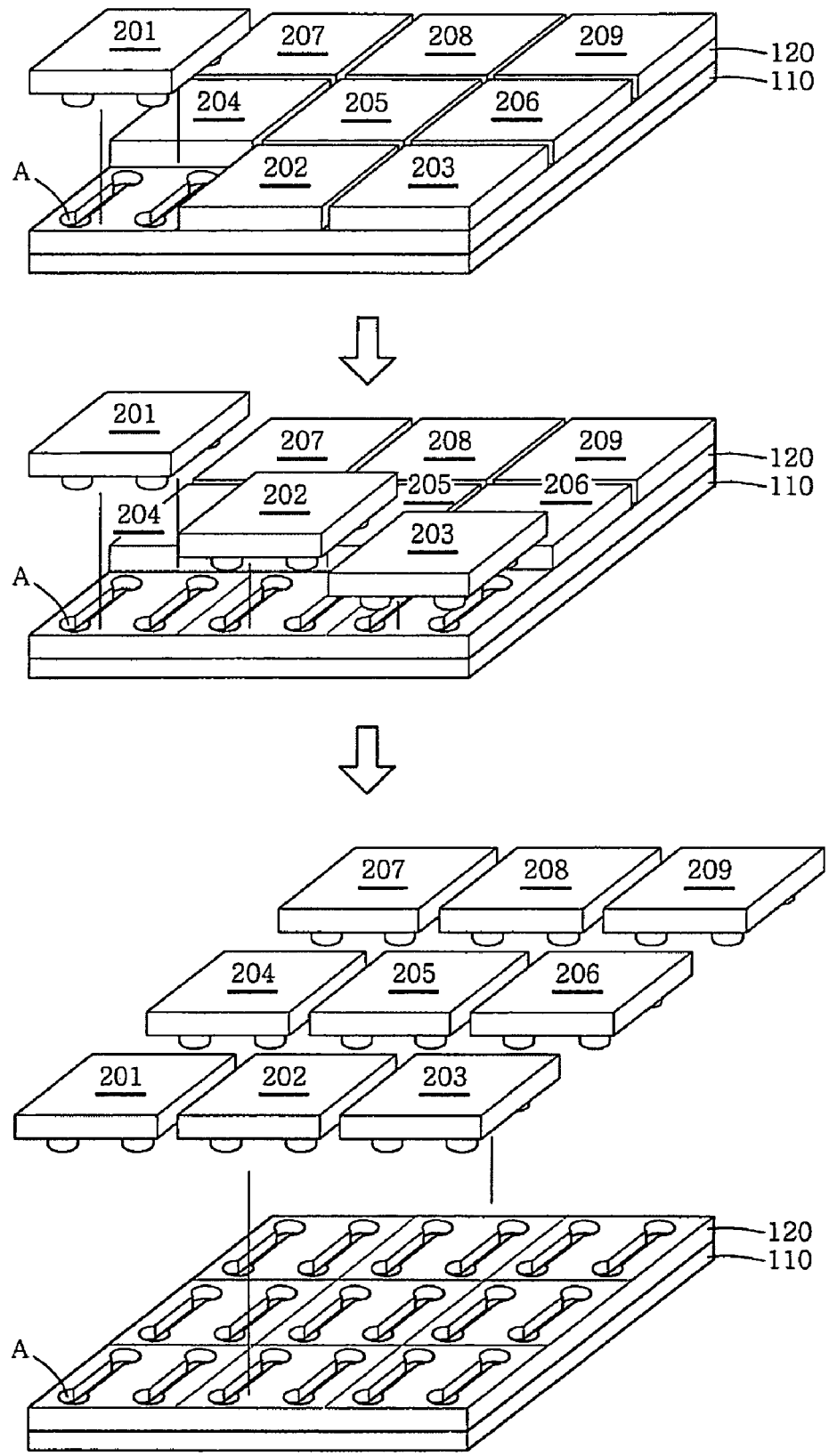

As shown in FIG. 2C, the plurality of molds 201-209 is sequentially removed from the cured insulating layer 120 of the base substrate 110, thereby forming a plurality of grooves A of circuit patterns in the cured insulating layer 120 (S130). As such, it is preferred that one or more molds 201-209 be sequentially removed as long as the grooves A of the circuit patterns are not damaged by adhesion between the molds 201-209 and the insulating layer 120.

In this way, as the plurality of molds 201-209 is sequentially removed from the cured insulating layer 120, adhesion between the molds 201-209 and the insulating layer 120 is minimized, and the molds 201-209 may be easily removed from the insulating layer 120. Thereby, the grooves A of the circuit patterns formed in the cured insulating layer 120 of the base substrate 110 are not damaged.

In addition, as is apparent from FIGS. 2B and 2C, since the insulating layer 120 of the base substrate 110 is imprinted with the plurality of molds 201-209 each having a regular size, the pressure applied to each of the plurality of molds 201-209 is easily controlled, resulting in uniformly formed grooves A of the circuit patterns in the insulating layer 120. Hence, a uniform circuit pattern can be formed on a large base substrate (or PCB) having a size of about 405 mm×510 mm or more.

Figure 2D:
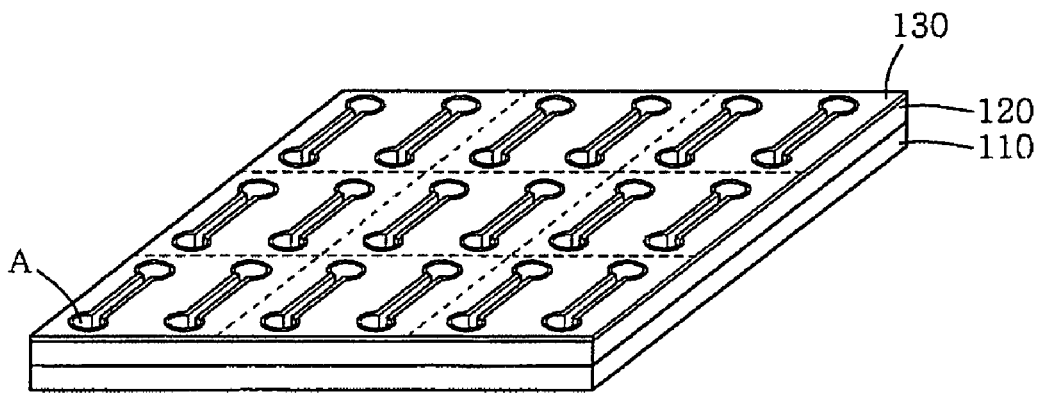

As shown in FIG. 2D, in order to conduct a copper electroplating process for the formation of a circuit pattern 150, an electroless copper plating layer 130 is formed on the cured insulating layer 120 and in the groves A of the circuit patterns (S140).

The process of forming the electroless copper plating layer 130 is conducted through catalyst deposition, including the steps of cleaning, soft etching, pre-catalysis, catalysis, acceleration, electroless copper plating, and oxidation prevention.

Alternatively, the process of forming the electroless copper plating layer 130 is conducted through sputtering, in which ion particles (e.g., Ar$^+$) of gas generated by plasma collide with a copper target, thus forming an electroless copper plating layer 130 on a cured insulating layer 120 and in grooves A of circuit patterns.

Figure 2E:
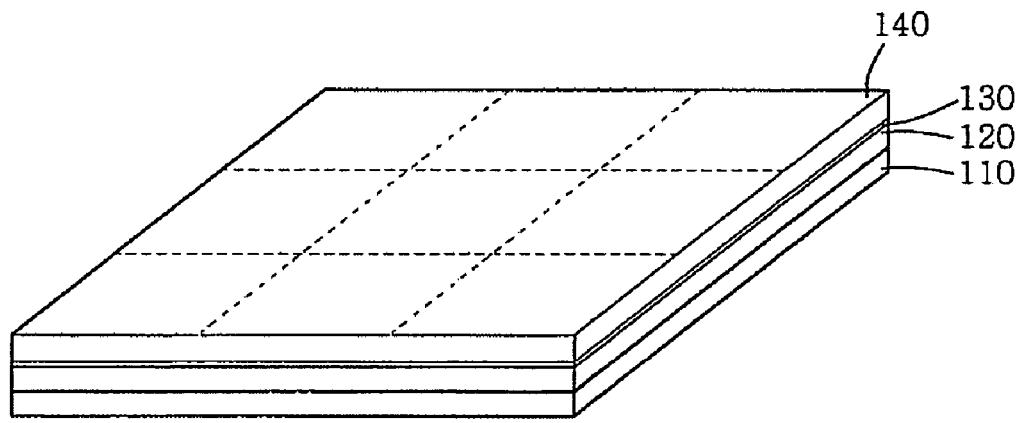

As shown in FIG. 2E, in order to fill the grooves A of the circuit patterns with a conductive material, a copper electroplating layer 140 is formed on the entire surface of the electroless copper plating layer 130 (S150).

The process of forming the copper electroplating layer 140 is conducted using a DC rectifier after a substrate has been dipped into a copper plating bath. Such copper electroplating is preferably carried out by calculating the plating area and then applying a predetermined current required to plate the calculated plating area using the DC rectifier, to deposit copper.

The copper electroplating process is advantageous because the copper plating layer has physical properties superior to the electroless copper plating layer and is easily formed to be thick.

As the copper plating wire for use in the formation of the copper electroplating layer 140, a separately formed copper plating wire may be used. However, in a preferred embodiment of the present invention, the electroless copper plating layer 130 preferably serves as the copper plating wire for the formation of the copper electroplating layer 140.

Figure 2F:
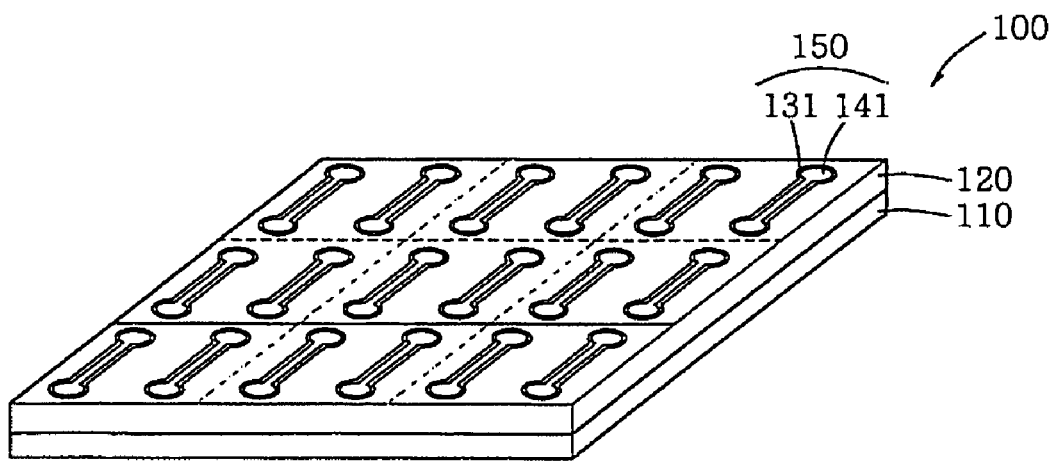

As shown in FIG. 2F, in order to remove unnecessary copper plating layers, the surface of the copper plating layer having the electroless copper plating layer 130 and the copper electroplating layer 140 is polished until the cured insulating layer 120 is exposed, thereby forming the circuit pattern 150 filled with copper plating layers 131 and 141 (S160).

The surface polishing process is exemplified by chemical-mechanical polishing to polish the surface of the plating layer using a chemical reaction and mechanical polishing. In the chemical-mechanical polishing, the substrate in contact with a polishing pad is supplied with slurry for polishing, whereby the surface of the substrate undergoes a chemical reaction and, simultaneously, is physically flattened by the motion of a polishing table, equipped with a polishing pad, relative to a polishing head holding the substrate.

Subsequently, laminating an insulating layer, aligning a plurality of molds on a base substrate, imprinting the insulating layer of the base substrate with the plurality of molds, sequentially removing the molds from the insulating layer of the base substrate, forming an electroless copper plating layer, forming a copper electroplating layer, and surface polishing are repeatedly conducted to obtain the desired number of layers. Then, forming a solder resist, nickel/gold plating, and forming the external appearance are further performed, thereby manufacturing a PCB 100, according to the present invention.

In the method of manufacturing a PCB using an imprinting process according to the present invention, the copper plating layer is not limited to a plating layer consisting completely of pure copper, but means a plating layer consisting mainly of copper. This can be checked by analyzing the chemical composition of the copper plating layer using an analyzing device, such as EDAX (Energy Dispersive Analysis of X-rays).

Further, in the method of manufacturing a PCB using an imprinting process according to the present invention, the plating layer may be formed of a conductive material, such as gold (Au), nickel (Ni), tin (Sn), etc., as well as copper (Cu), depending on the end purpose thereof.

As described hereinbefore, the present invention provides a method of manufacturing a PCB using an imprinting process. According to the method of the present invention, grooves of circuit patterns are formed in an insulating layer using a plurality of molds under predetermined pressure, and thus a uniform circuit pattern can be formed in a subsequent procedure.

In addition, according to the method of manufacturing a PCB using an imprinting process of the present invention, the plurality of molds is sequentially removed from the insulating layer, thereby decreasing adhesion between the mold and the insulating layer. Thus, the molds are easy to remove from the insulating layer.

In addition, according to the method of manufacturing a PCB using an imprinting process of the present invention, since a plurality of small molds is prepared for use, designs for molds can be easily varied, and preparation time and expense incurred to change the designs are low.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a printed circuit board using an imprinting process, comprising the steps of:
    aligning a plurality of individual molds, each of which has a pattern corresponding to a circuit pattern, on a base substrate having an insulating layer laminated thereon, wherein each of the individual molds is configured to be independently removed from the base substrate;
    imprinting the insulating layer of the substrate with the plurality of individual molds, and curing the insulating layer;
    sequentially removing two or more of the individual molds from the insulating layer, to form grooves of circuit patterns in the insulating layer;
    forming an electroless plating layer on the insulating layer and in the grooves of the circuit patterns;
    forming an electroplating layer on the electroless plating layer; and
    polishing the electroless plating layer and the electroplating layer until the insulating layer is exposed.

2. The method as set forth in claim 1, wherein the steps of imprinting the insulating layer of the substrate with the plurality of individual molds and curing the insulating layer are simultaneously conducted.

\* \* \* \* \*